United States Patent
Waechtler et al.

(10) Patent No.: US 9,005,705 B2
(45) Date of Patent: Apr. 14, 2015

(54) METHOD FOR THE PRODUCTION OF A SUBSTRATE HAVING A COATING COMPRISING COPPER, AND COATED SUBSTRATE AND DEVICE PREPARED BY THIS METHOD

(75) Inventors: Thomas Waechtler, Chemnitz (DE); Stefan Schulz, Chemnitz (DE); Thomas Gessner, Chemnitz (DE); Steve Mueller, Reinsdorf (DE); André Tuchscherer, Chemnitz (DE); Heinrich Lang, Chemnitz-Harthau (DE)

(73) Assignees: Fraunhofer-Gesellschaft zur Foerderung der Angewandten Forschung E.V., Munich (DE); Technische Universitaet Chemnitz, Chemnitz (DE)

( * ) Notice: Subject to any disclaimer, the term of this patent is extended or adjusted under 35 U.S.C. 154(b) by 288 days.

(21) Appl. No.: 13/232,569

(22) Filed: Sep. 14, 2011

(65) Prior Publication Data

US 2013/0062768 A1    Mar. 14, 2013

(51) Int. Cl.
*C23C 16/00*    (2006.01)
*C23C 16/18*    (2006.01)
(Continued)

(52) U.S. Cl.
CPC .......... *C23C 16/18* (2013.01); *H01L 21/76898* (2013.01); *H01L 21/28562* (2013.01); *H01L 21/76873* (2013.01); *C23C 16/45553* (2013.01)

(58) Field of Classification Search
CPC .............. C23C 16/44; C23C 16/45531; C23C 16/45527; C23C 16/45525; C23C 16/45523; C23C 16/455; C23C 16/45529; C23C 16/45534

USPC ....................... 427/250, 252, 248.1
See application file for complete search history.

(56) References Cited

U.S. PATENT DOCUMENTS

| 6,033,584 A | 3/2000 | Ngo et al. |
| 6,464,779 B1 | 10/2002 | Powell et al. |

(Continued)

FOREIGN PATENT DOCUMENTS

WO    WO 2009071076 A1 *  6/2009

OTHER PUBLICATIONS

Xianqin Wang et al., "Time-resolved Studies for the Mechanism of Reduction of Copper Oxides with Carbon Monoxide: Complex Behavior of Lattice Oxygen and the Formation of Suboxides.", The Journal of Physical Chemistry B, vol. 108., Jun. 22, 2004, pp. 13667-13673.

(Continued)

*Primary Examiner* — Kelly M Gambetta
(74) *Attorney, Agent, or Firm* — Greenblum & Bernstein, P.L.C.

(57) ABSTRACT

A method for producing a substrate with a copper or a copper-containing coating is disclosed. The method comprises a first step wherein a first precursor, a second precursor and a substrate are provided. The first precursor is a copper complex that contains no fluorine and the second precursor is selected from a ruthenium complex, a nickel complex, a palladium complex or mixtures thereof. In the second step, a layer is deposited at least on partial regions of a surface of the substrate by using the first precursor and the second precursor by means of atomic layer deposition (ALD). The molar ratio of the first precursor:second precursor used for the ALD extends from 90:10 to 99.99:0.01. The obtained layer contains copper and at least one of ruthenium, nickel and palladium. Finally, a reduction is performed step in which a reducing agent acts on the substrate obtained after depositing the copper-containing layer.

25 Claims, 4 Drawing Sheets

(51) Int. Cl.
*H01L 21/768* (2006.01)
*H01L 21/285* (2006.01)
*C23C 16/455* (2006.01)

(56) References Cited

U.S. PATENT DOCUMENTS

| | | | |
|---|---|---|---|
| 6,482,740 B2 | 11/2002 | Soininen et al. | |
| 6,869,876 B2* | 3/2005 | Norman et al. | 438/680 |
| 6,903,013 B2 | 6/2005 | Chan et al. | |
| 6,921,712 B2 | 7/2005 | Soininen et al. | |
| 6,933,011 B2 | 8/2005 | Senzaki | |
| 6,984,591 B1* | 1/2006 | Buchanan et al. | 438/778 |
| 7,220,671 B2* | 5/2007 | Simka et al. | 438/680 |
| 2007/0059502 A1 | 3/2007 | Wang et al. | |
| 2007/0105375 A1* | 5/2007 | Lavoie et al. | 438/687 |
| 2008/0296768 A1 | 12/2008 | Chebiam et al. | |
| 2010/0301478 A1* | 12/2010 | Waechtler et al. | 257/741 |

OTHER PUBLICATIONS

Yao Zhi Hu et al., "In Situ Rapid Thermal Oxidation and Reduction of Copper Thin Films and Their Applications in Ultralarge Scale Integration.", Journal of The Electrochemical Society, vol. 48, No. 12., Oct. 19, 2001, pp. G669-G675.

Ron Powell et al., "Characterization of Copper Oxidation and Reduction Using Spectroscopic Ellipsometry.", Proceedings of SPIE, vol. 4182., Sep. 2000, pp. 97-105.

Yasushi Sawada et al., "The Reduction of Copper Oxide Thin Flms with Hydrogen Plasma Generated by an Atmospheric-pressure Glow Discharge.", Journal of Physics D: Applied Physics, vol. 29., May 23, 1996, pp. 2539-2544.

P. J. Soininen et al., "Reduction of Copper Oxide Film to Elemental Copper.", Journal of The Electrochemical Society, vol. 152, No. 2., 2005, pp. G122-G125.

Donald M. Littrell et al., "Hydrazine Reduction of Transition-metal Oxides.", Journal of Chemical Society Faraday Transaction, vol. 83, No. 11., Jan. 1, 1987, pp. 3271-3282.

Y.K. Sun et al., "Catalytic decomposition of formic acid on Ru(001): Transient measurements.", Journal of Chemical Physics, vol. 94, No. 6., 1991, pp. 4587-4599.

M.R. Columbia et al., "The Interaction of Formic Acid with Transition Metal Surfaces, Studied in Ultrahigh Vacuum.", Journal of Electroanalytical Chemistry, vol. 369., 1994, pp. 1-14.

P.D. Kirsch et al., "Chemical and thermal reduction of thin films of copper (II) oxide and copper (I) oxide.", Journal Applied Physics, vol. 90, No. 8., 2001, pp. 4256-4264.

J.S. Shaikh et al., "Synthesis and Characterization of Ru Doped CuO thin Films for Supercapacitor Based on Bronsted Acidic Ionic Liquid.", Electrochimica Acta, vol. 56., 2011, pp. 2127-2134.

Stephen J. Gentry et al., "Study of the Promoting Influence of Transition Metals on the Reduction of Cupric Oxide by Temperature Programmed Reduction.", Journal Chemical Society., Faraday Trans. 1, vol. 77., Jan. 1, 1981, pp. 603-619.

Thomas Waechtler et al., "ALD-grown Seed Layers for Electrochemical Copper Deposition Integrated with Different Diffusion Barrier Systems.", Microelectronic Engineering, vol. 88, No. 5., May 2011, pp. 684-689.

Zhengwen Li et al., "Thin, Continuous, and Conformal Copper Films by Reduction of Atomic Layer Deposited Copper Nitride.", Chemical Vapor Deposition, vol. 12, No. 7., 2006, pp. 435-441.

Tobias Torndahl et al., "Growth of copper metal by atomic layer deposition using copper (I) chloride, water and hydrogen as precursors.", Thin Solid Films, vol. 458., 2004, pp. 129-136.

Jinshan Huo et al., "Characteristics of copper films produced via atomic layer deposition.", Journal of Materials Research, vol. 17, No. 9., Sep. 2002, pp. 2394-2397.

Hoon Kim et al., "Thin and Smooth Cu Seed Layer Deposition using the Reduction of Low Temperature Deposited Cu2O.", Material Research Society Symposium Proceedings, vol. 914., 2006, pp. 167-172.

Raj Solanki et al., "Atomic Layer Deposition of Copper Seed Layers.", Electrochemical and Solid-State Letters, vol. 3, No. 10., Aug. 3, 2000, pp. 479-480.

Mikko Utriainen et al., "Studies of metallic thin film growth in an atomic layer epitaxy reactor using M(acac) 2 (M=Ni, Cu, Pt) precursors.", Applied Surface Science, vol. 157., 2000, pp. 151-158.

Jae Y. Kim et al., "Reduction of CuO and Cu2O with H2: H Embedding and Kinetic Effects in the Formation of Suboxides.", Journal of the American Chemical Society, vol. 125., Aug. 6, 2003, pp. 10684-10692.

Jae Y Kim et al., "Reaction of CuO with hydrogen studied by using synchrotron-based x-ray diffraction.", Journal of Physics: Condensed Matter, vol. 16., Aug. 6, 2004, pp. S3479-S3484.

S. Poulston et al., "Surface Oxidation and Reduction of CuO and Cu2O Studie Using XPS and XAES.", Surface and Interface Analysis, vol. 24., Aug. 16, 1996, pp. 811-820.

M.H. Yamukyan et al., "Copper Oxide Reduction by Hydrogen under the Self-Propagation Reaction Mode.", Journal of Alloys and Compounds, vol. 473., 2009, pp. 546-549.

M. R. Baklanov et al., "Characterization of Cu Surface Cleaning by Hydrogen Plasma.", Journal of Vacuum Science & Technology. B vol. 19, No. 4., Jul./Aug. 2001, pp. 1201-1211.

* cited by examiner

METHOD FOR THE PRODUCTION OF A SUBSTRATE HAVING A COATING COMPRISING COPPER, AND COATED SUBSTRATE AND DEVICE PREPARED BY THIS METHOD

TECHNICAL FIELD

The invention relates to a method for depositing thin copper layers or copper-containing layers by means of atomic layer deposition (ALD). This method is suitable in particular for depositing copper or copper-containing layers on semiconductor substrates. In this respect, for example, semiconductor substrates for the production of multilayer conductor track or interconnect systems in highly integrated microelectronic circuits (ULSI circuits), non-ferromagnetic conductive spacer layer between two ferromagnetic films, particularly giant magnetoresistance (GMR) sensor elements, or 3D integration for electrical connecting of vertical bonded chips/wafers by through silicon vias (TSVs) are to be mentioned.

BACKGROUND

In general, physical methods, especially cathode sputtering, have been used to date for the production of thin copper layers. However, this method has the disadvantage that, for example in the production of copper starting layers for the interconnect system of highly integrated circuits—with increasing reduction of the geometrical dimensions—uniform closed surface layers are no longer obtained. Regarding the coating of patterned substrates, for example seed layers for ULSI interconnects, only poor conformality is achieved with physical methods like PVD and voids can be created, which may, for example increase the line resistance. In the case of spintronic layers stacks, ferromagnetic films as well as non-magnetic spacer layers produced by sputtering processes and possibly by the molecular beam epitaxy (MBE) technique, the GMR effect decreases dramatically due to the softening of interfaces by unwanted sputtering or intermixing effects.

Chemical methods, for example, variants of chemical vapor deposition (CVD), D are suitable as alternative methods for producing such layers. Here, source substances or precursors which contain the desired metal (e.g. copper) in the form of a chemical compound are fed in the gaseous state to a vacuum chamber which is in the form of a hot- or cold-wall reactor and in which the layer deposition is subsequently effected. For this purpose, the precursors are converted into the gas phase prior to deposition. Accordingly, a layer formation reaction takes place on the surface of the heated wafer substrate. This may consist in targeted thermally controlled decomposition of the precursor; often, reducing or oxidizing agents are also necessary for the layer deposition. However, the CVD methods have the disadvantage that the layer growth is not uniform here and closed surface layers form only from a thickness of a few 10 nm.

By using atomic layer deposition (ALD), these disadvantages can be avoided. ALD is a cyclic method in which two reactants may be fed to the reaction chamber in pulses. The corresponding pulses are separated from one another by inert purging and/or evacuation steps so that the two reactants never meet one another in the gas phase and exclusively surface reactions of the second reactant with adsorbates of the first reactant lead to layer formation. The first reactant is initially chemisorbed on the substrate surface so that the substrate is substantially covered with a monolayer of the precursor. Further monolayers which form by physisorption are removed during the purging or evacuation pulses. It is therefore necessary for the precursor to be able to undergo chemisorption on the substrate to be coated. After introduction of the second reactant, the desired films are obtained with layer thicknesses typically less than one monolayer (per cycle). By means of the ALD method, it is therefore possible to control the desired layer thickness very accurately via the number of ALD cycles; highly conformal layers are obtained.

In order to produce copper layers by means of ALD, in general two approaches can be chosen for the deposition:

Either elemental copper can be produced directly during the ALD process with reducing agents. However, for reducing the Cu in the precursor molecules, high process temperatures >300° C. with molecular hydrogen $H_2$ as co-reactant are necessary. Thus, the formation of ultrathin (<10 nm) and continuous copper films is almost unrealizable due to the strong tendency of copper for minimizing the surface and interface energy by formation of spherical copper particles, particularly on oxides (e.g. $SiO_2$, a typical substrate in TSVs) or transition metal nitrides (e.g. TaN, a typical copper diffusion barrier in ULSI devices), which is reasoned by huge surface energy mismatches. The agglomeration tendency can be avoided by using lower process temperatures and stronger reducing agents, like atomic hydrogen generated by plasma discharges. Nevertheless, plasma processes are incapable to achieve conformal reductions in high aspect ratio structures due to the preferred reaction of the atomic hydrogen on free areas and less on shadowed areas, deep trenches or vias.

On the other hand, elemental copper films can be realized by the reduction of intermediate ALD copper compounds. The reduction can be a part of the ALD process itself or fulfilled within a subsequent reduction process. Intermediate copper compounds may be copper nitride or copper oxide. Usually, these ALD processes can be handled at lower temperatures for avoiding the agglomeration of the ultrathin ALD films and do not require plasma-based processing.

U.S. Pat. No. 6,869,876 B2 describes a method in which first a copper halide layer is produced on the substrate with copper(I) and copper(II) complexes as a precursor; this layer is then reduced by means of a reducing agent, for example diethylsilane, to give a copper layer.

U.S. Pat. No. 6,482,740 B2 describes an ALD method in which a copper oxide layer is first obtained. Here, copper(I) and copper(II) compounds, for example, $(PEt_3)Cu(hfac)$ are used as a precursor. For producing the oxide layer, in each case an oxidation pulse is carried out during an ALD cycle. For reducing the copper oxide layer, a reduction at temperatures higher than 300° C. is effected.

The above methods have the disadvantage that fluorine-containing precursors are used. Fluorine can accumulate at the interface with the substrate material and reduce the adhesion of the copper layer to the substrate there.

US 2010/0301478 A1 discloses an ALD method in which 18 valence electron copper β-diketonate precursors and similar precursors are used which are not fluorine-containing. Intermediate copper oxide layers are reduced by means of a reducing agent.

According to one aspect, there is still a need to find a highly efficient thermal reduction process for reducing ultrathin copper oxide films to metallic copper on arbitrary substrates. According to a further aspect, there is a need for low temperature processes for avoiding film agglomeration.

SUMMARY OF THE INVENTION

According to one aspect, the present invention overcomes at least some of the disadvantages of the prior art and provides an improved ALD method for producing a copper layer.

A method can be used for the production of a coated substrate. The coating contains copper. A first and a second precursor as well as a substrate are provided. The first precursor is a copper precursor, in particular a copper complex which contains no fluorine. The second precursor is a ruthenium complex, a nickel complex or a palladium complex. A copper-containing layer is deposited by means of atomic layer deposition (ALD) at least on partial regions of the substrate surface by using the first and the second precursor.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION

Figure 1:
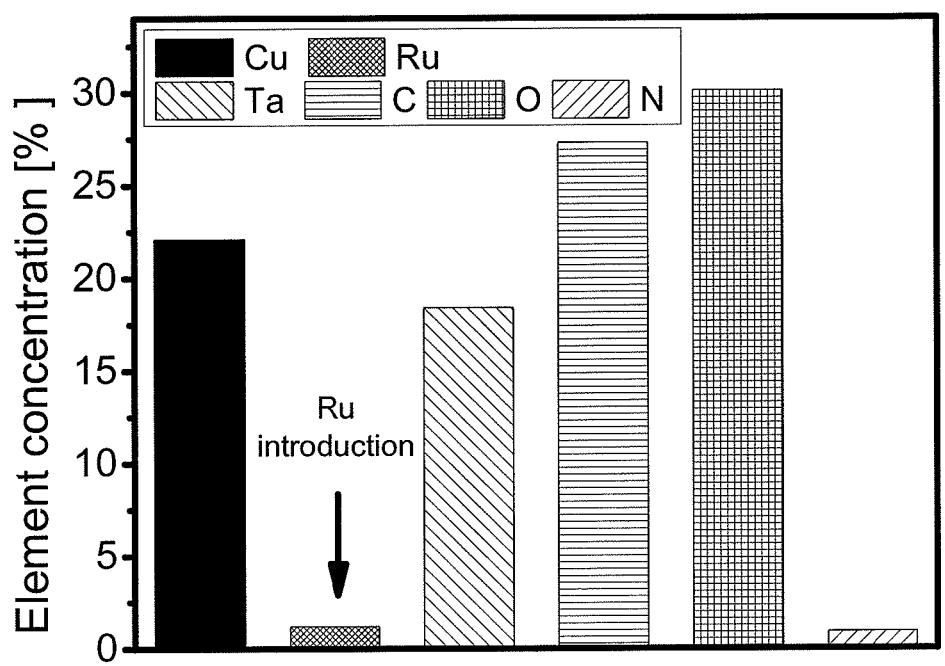
FIG. 1 shows a spectrum of an ALD copper oxide film on a TaN substrate obtained by Auger electron spectroscopy.

The present invention provides a method by means of which a substrate can be coated with a copper-containing layer. The layer deposition is effected by means of atomic layer deposition (ALD). A copper complex that contains no fluorine is used as a first precursor. As a second precursor, a ruthenium complex, a nickel complex, a palladium complex and mixtures thereof, respectively, are used. The method according to the invention can be carried out in three variants. Either a reduction step can be effected after the predetermined number of ALD cycles has been completed. Alternatively, the reduction of the deposited copper-containing layer can be effected by means of a reduction pulse during an ALD cycle. Finally, it is also possible to entirely dispense with the reduction step if a coating comprising predominantly elemental copper (besides ruthenium, nickel and/or palladium) is not desired but a layer comprising predominantly copper oxide or another copper salt is desired in fact. Besides this also a so called "flash ALD" is possible, wherein a decomposition of the precursor complexes is effected by means of radiation, for example UV light.

In the method according to the invention, the first and the second complex are used in a molar ratio (of the total amount of precursors) where the ratio of the first precursor is at least 90%, and particularly extends from 90% to 99.99% and, correspondingly, the ratio of the second precursor may be up to 10%, and particularly extends from 0.01% to 10%. This range is particularly useful due to the fact that the second precursor and the metal obtained from the second precursor by decomposition, respectively, is intended to act as a catalyst.

According to an embodiment, the molar ratio of first precursor:second precursor is preferably in the following range: at least 98 mol-%, particularly at least 99 mol-%, for example at least 99.5 mol-% for the first precursor and, correspondingly, not more than 2 mol-%, particularly not more than 1 mol-%, for example not more than 0.5 mol-% for the second precursor. High amounts of the second precursor, particularly if a palladium or ruthenium precursor is used, are uneconomical. Further, very high amounts of the second precursor might give rise to unwanted changes in film (coating) morphology and demands variations of process parameters.

According to the invention, it was recognized that using a second precursor in an ALD process for the production of a copper-containing layer may result in an improved coating and/or an improved coating process. In particular, if second precursors being ruthenium, nickel and/or palladium complexes are used, the decomposition products of said precursors, for example the elemental metals, and—in case an oxidation step is included in the ALD process—also the oxidation products of the second precursors, respectively, seem to act as catalysts for the reduction step of the method according to the invention. According to the invention, it was further recognized that the conversion efficiency of copper salts, particularly copper oxides to metallic copper at low temperatures, particularly temperatures below 150° C., is clearly improved, if the thermal reduction step of copper oxide films, copper oxide- and copper-containing films and other copper salt-containing films, respectively, is carried out. Likewise, the second precursors and their decomposition products seem to have a catalytic effect regarding oxidation steps. For example oxygen ($O_2$) seems to be cleaved by means of the catalyst and, thus, formation of an increased amount of copper(II) rather than copper (I) can often be observed. Regarding a reduction, in particular, the reduction of oxidic ALD copper layers or other ALD layers containing copper salts is more independent from the nature of the substrate on which the copper-containing film is formed, particularly, film agglomeration may be avoided to a greater extent or fully avoided. Furthermore, reduction according to the present invention (which may be carried out at low temperatures) allows the conversion to metallic copper in high aspect ratio structures (for example in TSVs or via and trench patterns in ULSI metallization systems). Further, as an elementary new approach, the inventors of the present invention provided a completely new ALD processes, particularly regarding processes including either reduction steps or oxidation steps. It is the merit of the invention that a method is provided where a catalytically active metal is introduced into a layer or coating produced by ALD which may serve as catalyst during the ALD process or in a later step. Thus, not only coatings for semiconductor devices and the like but also copper coatings and copper oxide coatings, respectively, for other applications where ruthenium, palladium and/or nickel is required as a catalyst are provided, particularly if these catalysts are to be used in structures with high aspect ratios, small pores or the like.

Several possibilities for the use of the precursor system of first and second precursor are possible. Either, the first precursor and the second precursor are evaporated from different evaporation units simultaneously. However, in order to avoid that no second precursor is chemisorbed at the surface of the substrate at all, in case of doubt the pulse of the second precursor should start some milliseconds before the pulse of the first precursor. Alternatively, the first precursor and the second precursor, respectively, may be used in different adsorption pulses. Thus, between a number of copper layers, repeatedly ruthenium, nickel and/or palladium layers are produced.

According to a third alternative, the first and the second precursor are evaporated from the same evaporation unit and, thus, particularly a mixture of the first and the second precursor is used. The third alternative has the advantage that an ALD process may be carried out which—besides the addition of the second precursor—does not require any changes with respect to ALD processes according to the prior art. Particularly, no longer processing times (which are usually uneconomical) are required and no changes to the equipment are necessary, such as additional precursor delivery systems. According to this alternative, the formation of copper films or copper oxide films with a uniform distribution of ruthenium, nickel and/or palladium are obtained; with respect to copper films produced without a second precursor, usually no changes in film morphology, growth per cycle (GPC) and roughness of the ALD films are observed. Finally, it has to be mentioned that most mixtures of the first and the second precursor were storable under inert conditions, often even storable for a longer time.

According to an embodiment, the following (ALD) partial steps are effected in succession during the layer deposition step, wherein either a reduction pulse or an oxidation pulse, or both, an oxidation pulse and a reduction pulse, is always effected:

adsorption pulse followed by a purge pulse or evacuation pulse optionally oxidation pulse followed by a purge pulse or evacuation pulse optionally reduction pulse followed by a purge pulse or evacuation pulse.

The single completion of said partial steps represents an ALD cycle. The reduction pulse and the subsequent purge or evacuation pulse are required only when the reduction is to be carried out in each case during an ALD cycle and when the reduction takes place not only after the predetermined number of ALD cycles has been completed and the reduction is dispensed with entirely, respectively. If a reduction pulse is effected during the ALD cycles, it is frequently (in particular in the case of layer formation on metal substrates) not necessary to carry out an oxidation pulse beforehand.

During the adsorption pulse (also referred to as precursor pulse), the precursor is fed to the reaction chamber in which the ALD method is carried out, so that a chemisorption and optionally also a physisorption of the precursor on the substrate surface take place on the substrate arranged in the reaction chamber. For this purpose, the precursor is fed to the reaction chamber in vapor form (in particular by vaporization or sublimation of the liquid or solid precursor) or in the form of a precursor/solvent mixture which was converted into the vapor phase. Usually, a carrier gas, in particular an inert gas, such as, for example, argon, is used for this feed.

The adsorption pulse is followed by a purge pulse or an evacuation pulse. This has the function of removing excess precursor so that ideally only a monolayer of the chemisorbed precursor remains on the substrate surface.

If intended, an oxidizing agent is fed to the reaction chamber in the subsequent step. This oxidizing agent reacts with the chemisorbed precursor molecules so that as a rule copper or a copper oxide (or another copper compound formed by the oxidation—depending on the oxidizing agent used) forms.

This is followed once again by a purge or evacuation pulse in order to remove reaction products from the reaction chamber. Very generally, an inert gas (for example, argon) is as a rule used for the purge pulses.

If intended, this can be followed by a reduction pulse in which a reducing agent is fed to the reaction chamber. As a rule, at least partial, preferably complete, reduction of the copper salt (in particular copper oxide) obtained in the oxidation pulse to elemental copper takes place here. In order to remove the reaction products obtained during the reduction pulse from the reaction space too, a purge or evacuation pulse once again follows.

Replication of this ALD cycle several times results in growth of the desired layer on the substrate. Typically, an ALD process consists of more than 100 ALD cycles in order to produce layers having a thickness of several nanometers.

According to an embodiment, the ALD method is carried out in a temperature range in which the growth per cycle varies only very little or not at all with the temperature. This has the advantage that a conformal layer which is uniform everywhere and has high thickness homogeneity is obtained on the regions of the substrate which are to be coated (also in obscured spaces). In contrast to CVD processes, it is possible, in particular in this temperature window, owing to the slower and more controlled layer growth, to obtain layers which have a lower minimum thickness and moreover in many cases form closed layers even at layer thicknesses which are 5 nm or less than 5 nm.

With the method according to the invention, a closed layer is maintained even after the reduction step has been carried out.

According to an embodiment, of the method according to the invention, at least the first precursor, or the mixture of the first and the second precursor can be vaporized at moderate temperatures (up to 100° C.). Thus, at least the first precursor is liquid at these temperatures or can be sublimed. The conversion to the vapor phase can be effected, for example, by means of applying reduced pressure. The level of the vapor pressure of the precursor used is not important here; all that is relevant is that the precursor molecules can undergo chemisorption on the substrate surface to be coated. First precursors and mixtures of the first and the second precursor, respectively, which are already liquid under standard temperature and pressure conditions (i.e., at room temperature and atmospheric pressure) are particularly preferred. These have the advantage that they can be vaporized more easily and in a more controlled manner than solids.

However, the use of a solid first precursor may also be advantageous. Solids can, for example, be dissolved and can thus also be used in "liquid" form. Such solid or dissolved precursors can be vaporized or sublimed at a high rate with a corresponding metering or evaporator system even at very low vapor pressures.

Due to the lesser content of the second precursor, often a solid second precursor may be dissolved in a liquid first precursor. However, a precursor mixture may be handled more easily, if also the second precursor is liquid or easily evaporated. Besides this, in embodiments, where no precursor mixture but instead different evaporation units are used, again, a liquid precursor or a precursor being easily evaporated is more useful. However, second precursors being solid may also be used in the form of a solution by means of a solvent (which is not the first precursor) and evaporated later on.

According to an embodiment, in order to achieve liquid complexes, particularly complexes which are liquid under standard conditions, in the precursor complexes, ligands may be used which contain alkyl groups, particularly groups like trimethylphosphane, triethylphospane, tripropylphosphane, tributylphosphone, or other trialkylphosphanes, trimethylsilyl, triethylsilyl or other trialkylsilyls and, further, "normal" methyl, ethyl, propyl, butyl and higher alkyl groups and the like. It goes without saying that in each case linear, branched or cyclic alkyl groups may be used, for example n-propyl, isopropyl, n-butyl, isobutyl and tert-butyl or n-hexyl and cyclohexyl and the like. The silyl and alkyl groups may only be present in the backbone of ligands used for the first and the second precursor, the phosphanes may also be the ligand itself.

According to an embodiment, vapor pressure of the liquid or solid first precursor and preferably also the second precursor should be at least 0.005 mbar, particularly preferably 0.01 mbar, at the respective vaporization temperature, in order for the adsorption of a monolayer of precursor molecules on the substrate surface to take place in an industrially acceptable time so that the precursor pulse can be kept as short as possible. The vaporization temperature is preferably chosen here so that the complex just avoids decomposition as long as it is not yet present in the reaction chamber.

According to an embodiment, the first precursor complex is a copper(I) or a copper(II) complex. Independent from this, the first precursor complex may be an 18 valence electron copper complex or even a copper complex with less than 18 valence electrons, for example 16 valence electrons.

By using 18 valence electron copper complexes instead of 16 valence electron copper complexes, precursors having a substantially higher stability are used which, however, can be decomposed to copper or converted by oxidation into a copper salt, such as, for example, copper oxide, under milder conditions than the usual condition according to the prior art. These complexes are better suitable for the ALD since they show a lesser tendency to independent decomposition (for example, through disproportionation). This is associated with the fact that the precursors to be used can also be stored for a certain time without decomposition phenomena occurring and the method can therefore be carried out more economically.

According to an embodiment, regarding the copper complexes, in particular complexes of the formulae $L_nCu$ (wherein n=2, 3 or 4) or $L_nCu$ X∩X (wherein n=1 or 2 and X∩X stands for a ligand as defined below) the ligands L may be the same or different and very generally, any σ-donor-π acceptor or σ,π-donor-π acceptor can act as ligand L.

According to an embodiment, the following ligands may be mentioned in particular as ligands L: isonitriles, alkynes and olefins (including dienes as bidentate ligands in which $L_2$ is exactly one diene ligand or an ene-yne ligand in which both unsaturated groups are coordinated to the central atom), in particular olefin and/or alkyne complexes in which the olefin or the alkyne acts as a σ,π-donor-π acceptor, and finally phosphane ligands. In the case of the phosphane ligands having the formula $PR^6_3$, the radicals $R^6$ may be identical or different, complexes in which the radicals $R^6$ are identical usually being used. $R^6$ may also be, in particular, an alkoxy radical $OR^7$. The radicals $R^6$ and $R^7$ may be in particular alkyl or aryl radicals. Suitable alkyl radicals are branched, straight-chain or cyclic alkyls, in particular having 1 to 15 carbon atoms; the alkyl radicals methyl, ethyl, n-propyl, isopropyl, n-butyl or tert-butyl and cyclohexyl are particularly preferred. Suitable aryl radicals are all substituted and unsubstituted aryl compounds; these may also be linked via an alkylene linker to the phosphorus or oxygen atom.

A particularly preferred aryl radical is phenyl. All above alkyl and aryl radicals may also be substituted by heteroatoms or may carry functional groups having heteroatoms (for example a bidentate ligand in which a coordinating $NR^2$ group is present, wherein R is defined as described below). However, for cost reasons, pure hydrocarbon radicals are as a rule used. Suitable bidentate phosphane ligands are in particular ligands in which the two phosphorus atoms are linked via an ethylene or methylene linker. The remaining radicals bonded to the phosphorus atom correspond to the definition of the radicals $R^6$ and $R^7$. Bis(diphenylphosphino)ethane, bis(diphenylphosphino)methane and bis(diethylphosphino) ethane may be mentioned as particularly suitable bidentate phosphane ligands.

According to the invention the copper precursors as well as the second precursors may include at least one ligand X∩X.

Inter alia, a β-diketonate, a β-ketoiminate or a β-diiminate can be used as the bidentate ligand X∩X. Said ligand is therefore a ligand of the general formula R—C(X*)—$CR^8$—C(Y)—$R^1$ or

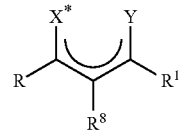

Here, X* and Y are identical or different and are O or $NR^2$.

Preferably, the radicals R, $R^1$, $R^2$ and $R^8$ here are identical or different and are branched, straight-chain or cyclic alkyl radicals, aryl radicals or trialkylsilyl radicals. $R^8$ may also be a hydrogen atom. Preferably, these radicals have 1 to 15 carbon atoms. The alkyl and aryl radicals may be substituted by heteroatoms but are, as a rule pure, hydrocarbons; likewise, the radicals may carry functional groups. Particularly preferably, R, $R^1$ and $R^2$ are methyl, ethyl, n-propyl, isopropyl, n-butyl, tert-butyl or phenyl and $R^8$ is hydrogen, methyl, ethyl, n-propyl, isopropyl, n-butyl, tert-butyl or phenyl. In the case of the trialkylsilyl radicals, the individual alkyl radicals may be identical or different; branched, straight-chain or cyclic alkyls are suitable; trialkylsilyl radicals having the alkyl radicals methyl, ethyl, n-propyl, isopropyl, n-butyl and tert-butyl are particularly preferred.

Particularly preferred β-diketonate ligands are acetylacetone ("acac"), heptane-3,5-dione, 2,6-dimethylhepta-3,5-dione, 2,2,6,6-tetramethylhepta-3,5-dione, N,N,N',N'-tetramethylmalonamide, N,N,N',N'-tetraethylmalonamide, 1,3-dimorpholin-4-ylpropane-1,3-dione, 1,3-diphenylpropane-1,3-dione and 1,3-dicyclohexylpropane-1,3-dione.

4-(Methylamino)-3-penten-2-one and 4-(ethylamino)-3-penten-2-one are particularly preferred as β-diketoiminate ligands.

(2Z,4E)-N-isopropyl-4-(methylimino)pent-2-en-2-amine and N-[(1E,2Z)-1-methyl-2-pyrrolidin-2-ylideneethylidene] methanamine are particularly preferred as β-diiminate ligands.

Alternatively, the bidentate ligand X∩X which may be present in the first and/or second precursor complex may be an amidinate, a carboxylate or a thiocarboxylate. In the general formula $R^3$—C(X')—Y' or

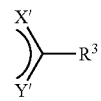

X' and Y' are therefore either two oxygen atoms or an oxygen and a sulfur atom or two $NR^4$ groups.

The radicals $R^3$ and $R^4$ are identical or different and are preferably branched, straight-chain or cyclic alkyl radicals or aryl radicals. Preferably, these radicals have 1 to 15 carbon atoms. The radicals may be substituted by heteroatoms but as a rule are pure hydrocarbons; likewise, the radicals may carry functional groups. Particularly preferably, the radicals $R^3$ and $R^4$ are methyl, ethyl, n-propyl, isopropyl, n-butyl, tert-butyl or phenyl. The radical $R^3$ may furthermore be a trialkylsilyl radical in which the individual alkyl radicals may be identical or different. Branched, straight-chain or cyclic alkyls are suitable here; the alkyl radicals methyl, ethyl, n-propyl, isopropyl or n-butyl and tert-butyl are particularly preferred.

In a further configuration, the amidinate, the carboxylate and the thiocarboxylate have a carboxylate group in the alkyl or aryl radical. In particular, carboxylates of the formula $R^5O—C(O)—Z—C(O)—O$ or

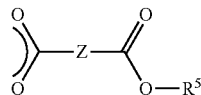

may be mentioned here.

Here, Z is an alkylene or alkylidene bridge or a single bond between the two carbonyl groups C(O). Preferably, the alkylene group has the formula $—(CH_2—)_n$ (where n=0, 1 or 2); the alkylidene bridge preferably has the formula $—(CH=CH—)_m$ (where m=0, 1 or 2).

The radical $R^5$ is preferably a branched, straight-chain or cyclic alkyl radical or an aryl radical, in particular a methyl, ethyl, n-propyl, isopropyl, n-butyl, tert-butyl or phenyl radical.

According to the invention, acetate, benzoate, benzylate, propionate, pivalonate, 2-methylpropionate, silyl-substituted acetates, thioacetate and N,N'-dimethylacetamidines are particularly preferred as the amidinate, carboxylate or thiocarboxylate ligand.

According to an embodiment copper complexes of the type $L_2Cu\ X∩X$ are used as first precursor. Among said complexes, the following copper complexes are particularly preferred. These are complexes which are easily obtainable synthetically and moreover are liquid at room temperature and can be easily converted into the gas phase and furthermore can be stored for a certain time. The following complexes may be mentioned here:

the acetylacetonate complexes (acac complexes) of the formula $(R^7{}_3P)_2Cu(acac)$ where $R^7$=methyl, ethyl, n-propyl, isopropyl, n-butyl and tert-butyl the heptane-3,5-dionate complexes of the formula $(R^7{}_3P)_2Cu(C_2H_5—C(O)—CH—C(O)—C_2H_5)$ where $R^7$=methyl, ethyl, n-propyl, isopropyl, n-butyl and tert-butyl the acetate complexes of the formula $(R^7{}_3P)_2Cu(O_2CCH_3)$ where $R^7$=methyl, ethyl, n-propyl, isopropyl, n-butyl and tert-butyl.

According to a further embodiment, the second precursor is selected from a ruthenium(III) complex, a ruthenium(II) complex, a ruthenium(0) complex, a nickel(II) complex, a nickel(0) complex, a palladium(II) complex and mixtures thereof.

Particularly, a ruthenium(II), nickel(II) or palladium(II) complex will be used as second precursor. However, also ruthenium(III), ruthenium(0) and a nickel(0) complexes may be used. In this respect the following complexes are to be mentioned: complexes of the type $Ru(X∩X)_3$, where $X∩X$ is the same ligand as defined above, ruthenium(0) complexes like ruthenium half-sandwich complexes of the type ArRuL or $ArRuL_2$ wherein Ar is an arene ligand, for example benzene ligand, or a ligand which is an arene derivative, for example benzene derivative, and L is a ligand L as described above with respect to copper complexes, for example

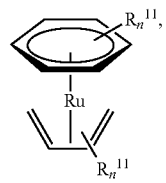

(compare A. Schneider et al. in Chem. Vap. Deposition 11 (2), 99-105 (2005)) wherein the number n is counted independently for each ligand and n=0, 1, 2 or even >2 for the aromatic ligand and n=0, 1, 2, 3 or 4 for the butadiene ligand. Further, the substituents $R^{11}$ may be the same or different, and may be selected from branched, cyclic or not branched alkyl groups, particularly short chain alkyl groups with up to 4 carbon atoms and from silyl groups $SiR^{21}{}_3$, wherein the silyl substituents $R^{21}$ may be the same or different, and may be selected from branched, cyclic and particularly from not branched alkyl groups, particularly short chain alkyl groups with up to 4 carbon atoms. All afore mentioned substituents may be introduced in order to provide a second precursor complex with a decreased melting point.

Nickel(0) complexes like complexes of the type $NiL_4$, wherein, again, ligand L has the same meaning as defined above with respect to copper complexes (with the proviso that L is not 4 times CO) wherein the ligands L may be the same or different, for example tetrakis(trialkylphosphane)nickel complexes. Of course, with respect to the above mentioned complexes instead of two monodentate ligands L, also one bidendate ligand or instead of three monodentate ligands L one tridentate ligand or instead four monodentate ligands L, one tetradentate ligand may be used.

According to an embodiment, ruthenium(II), nickel(II) or palladium(II) precursor complexes may have the following formulae $L^1L^2M$ (wherein M is Ru(II) Ni(II) or Pd(II)), or $L^3Ru(II)L^1L^4$, or the formulae of the corresponding dinuclear or multinuclear complexes.

In these complexes $L^1$ and $L^2$ may be the same or different and are bidentate ligands $X∩X$ or enyl ligands, $L^3$ represents a substituted or unsubstituted aren ligand and $L^4$ represents a monodentate carboxylate or thiocarboxylate ligand.

Ligand $X∩X$ stand for the same ligands as defined with respect to the copper precursor complexes defined above and is selected from the group consisting of β diketonates, β ketoiminates, β diiminates, amidinates, carboxylates and thiocarboxylates.

Enyl ligands are cyclic or non cyclic ligands and at least tridentate. Possible enyl ligands are for example substituted or unsubstituted cyclopentadienyl ligands, substituted or unsubstituted pentadienyl ligands and substituted or unsubstituted allyl:

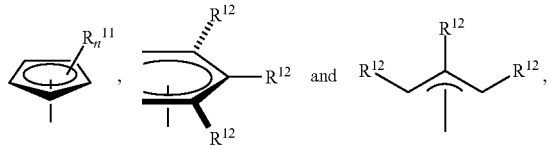

Again, in the cyclic ligands the number n (n=0, 1, 2 or even >2) of substituents $R^{11}$ may be the same or different, and may be selected from branched, cyclic or not branched alkyl groups, particularly short chain alkyl groups with up to 4 carbon atoms and from silyl groups $SiR^{21}{}_3$, wherein the silyl substituents $R^{21}$ may be the same or different, and may be selected from branched, cyclic and particularly from not branched alkyl groups, particularly short chain alkyl groups with up to 4 carbon atoms. $R^{12}$ may be the same or different, and may be selected from hydrogen, from branched, cyclic or not branched alkyl groups, particularly short chain alkyl groups with up to 4 carbon atoms and from silyl groups $SiR^{21}_3$, wherein the silyl substituents $R^{21}$ may be the same or different, and may be selected from branched, cyclic and particularly from not branched alkyl groups, particularly short chain alkyl groups with up to 4 carbon atoms. Again, all afore mentioned substituents $R^{11}$ and $R^{12}$ may be introduced in order to provide a second precursor complex with a decreased melting point.

Arene ligands, may for example be substituted or unsubstituted (monocyclic)benzene ligands or substituted or unsubstituted polycyclic aromatic ligands, particularly containing one or more six membered aromatic rings.

Only as an example, in the following possible ruthenium (II), nickel(II) or palladium(II) precursors are depicted:

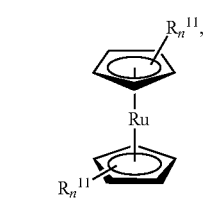

I

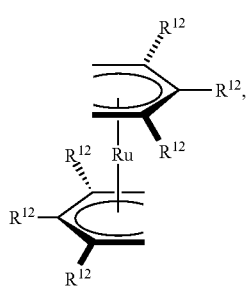

II

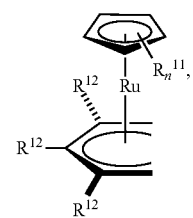

III hereinafter called unsubstituted or substituted cyclopentadienyl pentadienyl ruthenium complexes,

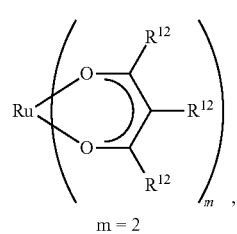

IV

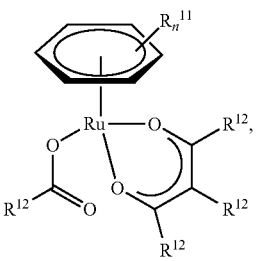

V

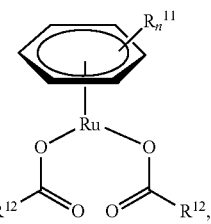

VI

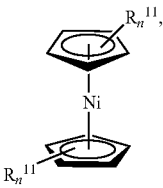

VII

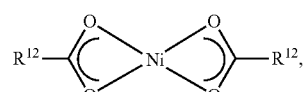

VIII

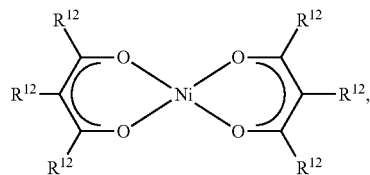

IX

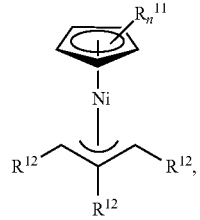

X

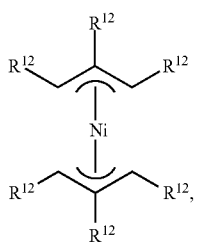

XI

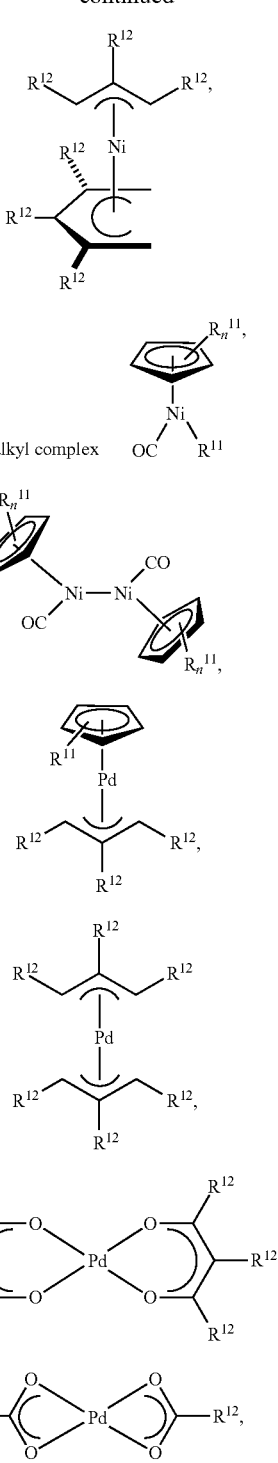

the alkyl complex wherein in all complexes having two allyl, two cyclopentadienyl, two pentadienyl or two carboxylate ligands the substitution pattern may be the same or different and wherein the substituents $R^{11}$ and $R^{12}$ are as defined above. In case two or more substituents $R^{11}$ and $R^{12}$, respectively, are present, the two or more substituents may be independent from each other the same or different substituent.

According to an embodiment, usually, a liquid or gaseous oxidizing agent is used for the oxidation pulse of the ALD method according to the invention. The oxidizing agent is preferably gaseous and furthermore, according to an embodiment, the oxidizing agent is selected from the group consisting of oxygen, water, $H_2O_2$, ozone, $N_2O$ and mixtures thereof. By means of the second precursor, a catalyst is provided which, particularly in case of ruthenium or palladium complexes, is usually decomposed to the elemental metal and, thus, supports the cleavage of the oxidizing agent. In turn, a more efficient oxidation can often be observed.

By means of these oxidizing agents an oxidation pulse can be carried out under relatively mild conditions (in particular even at temperatures in the range from 105° C. to 135° C.).

The use of wet oxygen (i.e., a mixture of water vapor and oxygen) is particularly useful since wet oxygen is a more effective oxidizing agent than oxygen or water vapor alone, and the ALD therefore functions better at low temperatures at which the precursor itself does not yet decompose. This is as a rule accompanied by a lower tendency of the copper-containing layer produced to undergo agglomeration.

According to an embodiment, the reducing agent for the reduction step or the reduction pulse is selected from the group consisting of hydrogen plasma, molecular hydrogen ($H_2$), carbon monoxide, hydrazine, boranes, silanes and organic reducing agents. Preferred reducing agents are molecular hydrogen ($H_2$), hydrazine, boranes, silanes and organic reducing agents. Presumably the catalyst derived from the second precursor promotes the disproportionation or dissociation of those reducing agents and, thus, gives rise to even more active reducing species like atomic hydrogen and the like. However, the catalyst does not necessarily promote only disproportionation of specific reduction agents. Besides this, it supports the formation of metallic copper. According to literature models, either a uniform sequential loss of oxygen until forming metallic copper or a non-uniform reduction by creating of small copper aggregates, which start to form around oxide defects and the reduction takes place mainly at the interface of copper/copper oxide. In case of the non-uniform reduction, the embedment of catalytically active Ru, Pd or Ni could enhance the generation of such copper nuclei.

In particular, alcohols, aldehydes and carboxylic acids may be mentioned here as organic reducing agents. These are usually low molecular weight compounds having a molecular weight of <100 g/mol, preferably <61 g/mol. Peculiar to compounds having such a low molecular weight is in fact that their oxidation products are relatively readily volatile and can therefore be relatively easily removed from the reaction chamber (or can be withdrawn from an equilibrium reaction). Very generally, all organic reducing agents have the advantage that they permit a reduction under mild conditions so that here too agglomeration and island formation do not occur during the reduction process or do so only to a rather small extent. If, on the other hand, hydrogen is used, usually no significant reduction occurs at temperatures of less than 200° C. (i.e., no reduction of the proportion of oxygen in the copper-containing layer—particularly with the use of hydrogen). Moreover, the ALD should preferably be carried out without the use of a plasma, in order to achieve a uniform layer growth in all regions, even in deep and geometrically complicatedly structured substrates. The use of a plasma can then also lead to a strong tendency to undergo agglomeration.

Methanol, isopropanol, formaldehyde, acetaldehyde, formic acid and acetic acid may be mentioned as particularly suitable organic reducing agents, among which again formic acid is very particularly preferred. Presumably, formic acid dissociates and reducing species such as CO and H are formed by means of the catalyst derived from the second precursor.

Peculiar to these compounds is that a reduction can take place under particularly mild conditions, in particular a reduction at temperatures of 200° C.; in the case of formic acid, even at temperatures of from 105 to 115° C.

The ALD method according to the invention is preferably carried out in such a way that the individual pulses (adsorption pulse, oxidation pulse, reduction pulse and purge or evacuation pulses) take as a rule each not more than 15 seconds. However, the pulse duration is also dependent on the volume of the respective reactor. Preferably, the length of the pulses is from 3 to 11 seconds. In the case of very compact reactor chambers, the required pulse length may also be in the range from 10 to a few 100 milliseconds.

For the adsorption pulse, it is furthermore true that the pulse duration is particularly preferably from 3 to 6 seconds. Furthermore, the pulse duration of the adsorption pulse is preferably exactly so long that at least a deposition rate or a growth per cycle of 0.08 Å/cycle and particularly preferably of 0.12 Å/cycle is achieved. This is as a rule the case when the pulse duration of the adsorption pulse is at least 2 seconds.

The adsorption pulse is preferably effected at a temperature of from 105 to 165° C., particularly preferably at a temperature of from 115 to 135° C. This temperature range is particularly reasonable if copper complexes of the type $L_2Cu\ X \cap X$ are used as first precursor.

In this temperature window, the growth per cycle shows relatively little dependence on the temperature, and a more targeted production of a copper layer or copper-containing layer having a certain layer thickness is therefore possible, particularly if copper complexes of the type $L_2Cu\ X \cap X$ are used as first precursor. The growth per cycle is usually particularly constant at a temperature of from 115 to 135° C.

Furthermore, according to an embodiment, the reduction step or the reduction pulse according to the invention is carried out at a temperature of <250° C., preferably <200° C. However, the temperature to be chosen also depends here on the reducing agent, so that—even if it were to be desirable to work at lower temperatures—a free selectivity of the reduction temperature exists only within certain limits. For example, a significant reduction will occur with the use of hydrogen ($H_2$) only from temperatures of 400 to 450° C. Relatively high temperatures are therefore required for the reduction of the copper oxide with molecular hydrogen ($H_2$). Owing to the increased tendency of the copper to undergo agglomeration at these temperatures, it is however then no longer possible to obtain thin and closed surface layers. A lower process temperature is possible through the use of hydrogen plasma. However, this has the disadvantage that the plasma affects structured substrates differently. Free surfaces are preferentially attacked whereas it is difficult to achieve complete reduction of the copper oxide or copper salt on side walls of deep trenches, in holes and in obscured regions.

The temperature should therefore be as low as possible if little agglomeration or island formation is to take place during the reduction step or reduction pulse. Carrying out the reduction step or reduction pulse at a temperature which corresponds to that of the adsorption pulse or is below this temperature is therefore preferred. This can be realized, for example, by means of organic reducing agents; the use of formic acid, which gives good results at a temperature as low as 105° C., is very particularly preferred here.

Furthermore, plasma processes should—if possible—be dispensed with in order to ensure uniform reduction of the layer applied by means of ALD, even in structured substrates or obscured regions of structured substrates. Purely thermal reduction processes are therefore preferred.

A one-layer or multilayer substrate can be used as the substrate to be coated. Here, at least one layer of the multilayer substrate (preferably that layer of the multilayer substrate which is adjacent to the copper layer or copper-containing layer) or the one-layer substrate itself is particularly preferably a transition metal, a transition metal salt (in particular a ceramic compound, such as a transition metal nitride or transition metal oxide), a semiconductor material, an organic polymer and/or an inorganic polymer or contains one or more substances of the abovementioned classes of substances.

According to an embodiment, the material of the aforementioned layers is selected from the group consisting of tantalum, titanium, tungsten, niobium, vanadium, tantalum nitride, titanium nitride, tungsten nitride, niobium nitride and vanadium nitride, platinum, palladium, ruthenium, rhodium, a silicon dioxide, a silicate, zinc oxide, hafnium oxide, aluminum oxide, zirconium oxide, silicon, germanium, gallium arsenide, aluminum gallium arsenide, gallium nitride, aluminum gallium nitride, indium phosphide, indium gallium phosphide and carbonitrides or silicon nitrides of transition metals, in particular of tantalum, tungsten and titanium; alternatively, this material may contain one or more of the abovementioned substances. According to a further embodiment, the material of the substrate or a substrate layer may be a magnetic material.

According to the invention, the substrate which can be produced by the method described above has, at least in part, a closed surface copper-containing coating, as a rule a completely closed surface copper-containing coating. According to the invention, a closed surface layer is understood as meaning a layer in which signals of the substrate are no longer detected on measurement by means of X-ray photoelectron spectroscopy (XPS—Mg—Kα radiation is used). The depth of emergence of the photoelectrons should be from 1 nm to 3 nm for this purpose in the case of a quasi-perpendicular take-off angle. The method of measurement is always carried out according to "S. Hofmann: Depth Profiling in AES and XPS in: Practical Surface Analysis Second Edition Volume 1—Auger and X-ray Photoelectron Spectroscopy. (Editors D. Briggs and M. P. Seah) John Wiley & Sons, Chichester et al., 1990".

The copper coating has no fluorine-containing impurities (since no fluorine-containing precursor molecules were used) and has a layer thickness of from 2 nm to 100 nm, preferably from 2 nm to 30 nm. According to the invention, the layer thickness is always measured by means of spectroscopic ellipsometry in the spectral range from 3.3 to 6.3 eV. The measurement is carried out according to H. G. Tompkins and E. A. Irene (Editors): Handbook of Ellipsometry. Springer-Verlag, Berlin 2005. For microelectronic and nanoelectronic components, integrated circuits, preferably copper nucleation layers having thicknesses of from 2 to 20 nm, are used for producing the conductor track system.

Furthermore, the copper coating does include the decomposition products of the second precursor, in particular elemental Ru, Ni and/or Pd. If no reduction step is carried out, the copper coating is a copper oxide coating. After the reduction step, a basically pure elemental copper coating containing only Ru, Ni and/or Pd and particularly no or almost no oxide/oxygen may be obtained (depending on the conditions of the reduction step).

Furthermore, the substrate according to the invention having a copper coating preferably has a roughness Ra according to DIN EN ISO 4287 of from 0.2 nm to 2.7 nm, with a roughness Ra of the uncoated substrate of from 0.1 nm to 0.2 nm. Ra was determined by means of atomic force microscopy (AFM) in the tapping mode. A silicon tip having a tip radius of ≤10 nm was used. The difference between the roughness Ra of the coated and the uncoated substrate is therefore generally from 0 to 2.5 nm, preferably from 0 to 0.2 nm. However, this difference is dependent firstly on the thickness of the coating and secondly on the surface of the substrate used.

Furthermore, the substrate according to the invention having a copper coating frequently has trenches, holes and/or obscured spaces. Such substrates cannot be coated at all by many methods according to the prior art (e.g., PVD and CVD methods), at least not with a uniform layer. The method according to the invention has the advantage that a uniform copper coating or copper-containing coating can be applied even to such substrates.

The method according to the invention can be used for the production of copper layers, in particular copper starting layers for subsequent electrochemical or electroless deposition of metal layers, in particular copper layers, in the production of contact and conductor track systems in microelectronic components, in the production of thin-film solar cells, and in the production of magnetic or spintronic sensor devices, e.g. giant magnetoresistance (GMR) devices. Besides this, the method according to the invention can be used for the production of catalytically active copper layers, containing catalytically active nickel and particularly catalytically active palladium or ruthenium.

For the production of a multilayer conductor track or interconnect system in highly integrated microelectronic circuits (ULSI circuits), copper layers in the range of 10 to 100 nm are applied electrochemically to prestructured silicon wafers provided with various functional layers. Geometrical dimensions of metal lines in the first metallization levels of state-of-the-art microprocessors are in the range of 30 to 40 nm in width with aspect ratios (AR) of two and more. Further technology nodes are achieving metal lines widths down to 20 nm in 2016 according to the scenario of the ITRS (The International Technology Roadmap for Semiconductors). For the subsequent filling of the patterns by electrochemical deposition (ECD) of copper, seed layers (also called nucleation layers) are necessary. Ideally, the seed layers are of the same material like the filler. Consequently, the huge challenge for the subsequent ECD process is the deposition of thin and highly conformal copper seed layers to obtain an excellent filling behavior in trenches and vias without detrimental voids. The method according to the invention is most suitable for producing such seed layers since a layer having uniform thickness forms, the thickness—as described—being arbitrarily adjustable and therefore always leading to success even in the case of geometrically complicated arrangements of through-hole vias between adjacent conductor track levels and the like.

If, in the field of so-called 3D or vertical system integration, a plurality of wafers or microchips are connected to one another permanently and mechanically by means of bond methods, so-called through-hole vias (THVs or through-silicon vias—TSVs) are used for producing electrical contacts between the individual chips. These are very deep, narrow holes (in particular having a diameter from 5 μm to 150 μm and aspect ratios of from 1 to 20) through the chip or wafer stack. In order to produce the electrical contact between the components to be connected, these holes are completely or partly filled by means of electrochemical copper deposition. For this purpose too, an electrically conductive seed layer is required. The method according to the invention is also most suitable for producing these seed layers since—even in the case of complicated geometries and extremely narrow and deep holes, respectively—copper layers having uniform thickness can be produced.

The above mentioned seed layers must meet high requirements. They must form a closed surface and grow without defects on the substrate present in each case, which generally comprises substrate materials or diffusion barrier layers of transition metals, such as tantalum or tungsten, or transition metal nitrides, such as tantalum nitride or tungsten nitride. Here, the seed layers must grow uniformly in all regions of the substrates to be coated. Layer thickness differences between the bottoms of trenches or holes, their side walls and free surfaces on the wafer substrate are undesired since otherwise nonuniform layer growth owing to nonuniform current density distribution would occur during the subsequent electrochemical copper deposition. At the same time, the seed layers should have very good electrical conductivity and as little roughness as possible. Finally, they must also adhere very well to the substrate so that the layer stack has high mechanical stability for subsequent polishing processes. Reduced adhesion of the copper layers moreover results in reduced electrical reliability of the conductor track in the subsequent component, in particular with regard to electromigration.

Moreover, copper is used as conductive spacer layer in GMR sensor applications. The discovery of the GMR in the late 1980s revolutionized non-volatile storage devices, like hard disk drives (HDDs). A typical design of a GMR system is composed of alternating ferromagnetic and conductive non-magnetic layers. The spin-dependent scattering probability of the electrons to the magnetic orientation on the interface between the conductive spacer and ferromagnetic layer as well as in the ferromagnetic film itself causes the huge resistance change. Antiparallel magnetic orientations of the ferromagnetic films (also called antiferromagnetic coupling) without an external field occur at certain thicknesses of the non-magnetic spacer layer. For example, the maxima of the GMR effect in Co/Cu film systems are oscillating in a period of 1 nm Cu film thickness. The intensity of the GMR effect depends on the order of the exchange coupling, the used material system, the film composition, and quality of the film interfaces. Huge GMR values of $\Delta R/R_0 > 65\%$ at room temperatures were demonstrated for Co/Cu systems by Parker et al. The needs of ultra sharp interfaces as well as atomic layer controlled growth of the spacer layers requires a highly sophisticated deposition techniques, which is provided with the present invention.

The method according to the invention and the copper layer which can be produced therewith are described in more detail below without limitation of the universality.

Preparation of Substituted Cyclopentadienyl Pentadienyl Ruthenium Complexes—General Route A suspension of 1 mmol ($\eta^4$-2,3-dimethylbutadiene)($\eta^5$-pentadienyl)iodoruthenium (wherein pentadienyl optionally represents a substituted pentadienyl ligand) in toluene was treated with optionally substituted 1.1 mmol cyclopentadienide thallium. The reaction mixture is refluxed for 24 h under vigorous stirring. After removing all volatiles in oil pump vacuum the residue is extracted with n-hexane and dried over MgSO$_4$. After removing the solvent the product was separated by column chromatography on Alox.

Preparation of [($\eta^5$-C$_5$H$_4$SiMe$_3$)($\eta^5$-C$_7$H$_{11}$)Ru]

A suspension of ($\eta_7^4$-2,3-dimethylbutadiene)($\eta^5$-2,4-dimethylpentadienyl)iodoruthenium (500 mg, 1.23 mmol) in toluene (20 mL) is treated with trimethylsilylcyclopentadienide thallium (366 mg, 1.35 mmol). The reaction mixture is refluxed for 24 h under vigorous stirring. After removing all volatiles in oil pump vacuum the residue is extracted five times with n-hexane (each 20 mL). The combined extracts were dried over MgSO$_4$. After removing the solvent the product was separated by column chromatography on Alox eluting ($\eta^5$-trimethylsilylcyclopentadienyl)($\eta^5$-2,5-dimethylpentadienyl)ruthenium with n-hexane. Yield: 280 mg (68%) of a yellow liquid.

Elemental Analysis: C$_{15}$H$_{29}$RuSi (338.55) calc.: C, 53.22%; H, 8.63%. found: C, 53.68%; H, 8.82%; FT-IR (NaCl, cm$^{-1}$): 3050, 2951, 2909, 2719, 1615, 1485, 1430, 1380, 1246, 1159, 1035, 894, 833, 753, 692, 629; $^1$H-NMR (500.30 MHz, CDCl$_3$) [δ (ppm)]: −0.10 (d, $^3J_{HH}$=2.28 Hz, 2H), 0.23 (s), 1.94 (s, 9H), 2.78 (d, $^3J_{HH}$=1.80 Hz, 2H), 4.33 (pt, $^3J_{HH}$=1.58 Hz, 2H), 4.70 (pt, $^3J_{HH}$=1.58 Hz, 2H), 5.44 (s, 1H); $^{13}$C{H}-NMR (125.13 MHz, CDCl$_3$) [δ (ppm)]: 0.50 (s), 28.17 (s), 40.72 (s), 81.68 (s), 82.03 (s), 82.62 (s), 92.38 (s), 92.53 (s).

($\eta^4$-2,3-dimethylbutadiene)($\eta^5$-2,4-dimethylpentadienyl)iodo-ruthenium (and also Bis($\eta^5$-2,4-dimethylpentadienyl)ruthenium and in general compound II) can be obtained according to the following reaction sequence (see A. Bauer et al. Organometallics, 2000, 19, 5471-5476):

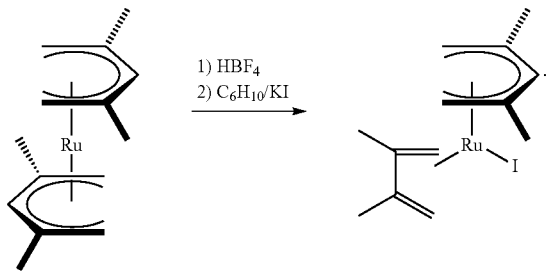

The preparation of other complexes which may be used as second precursor are described in T. Hur'yeva et al. Chem. Vap. Deposition, 12, 429-434 (2006) and T. Aaltonen et al. Electrochemical and Solid-State Letters 6 (9), C130-C133 (2003) (compound I); K. Kawano et al. Electrochemical and Solid-State Letters 9 (7), C107-C109 (2006) and EP 1 293 509 A2 (compound III); M. L. Green et al. J. Electrochem. Soc. 132 (11), 2677-2685 (1985) (compound IV); G. T. Stauf et al. Thin Solid Films 156, L31 L36 (1988) and J. Chae et al. Electrochemical and Solid-State Letters 5 (6), C64-C66 (2002) (compound VII); M. Utriainen et al. Applied Surface Science 157, 151-158 (2000) (compound IX); M. Ishikawaa et al. Journal of Crystal Growth 275, e1121-e1125 (2005) (compound X); J. Terao et al. Chem. Commun., 825-827 (2007) (compound XI); R. A. Fischer et al. Journal of Organometallic Chemistry 437, C29-C34 (1992) (compound XIII); W. Bemhardt et al. Journal of Organomerallic Chemistry 355, 427-436 (1988) (compound XIV); J.-C. Hierso et al. Chem. Mater. 8, 2481-2485 (1996) (compound XV); J. E. Gozum et al. J. Am. Chem. Soc. 110, 2688-2689 (1988) (compound XVI); K. S. Bousman et al. Inorganica Chimica Acta 357, 3871-3876 (2004) (compound XVII) and N. Itoh et al. Catalysis Today 104, 231-237 (2005) (compound XVIII). Regarding the synthesis of copper precursors it is referred to the prior art cited above, for example US 2010/0301478 A1.

Thermal ALD Process Conditions—Formation of Cu$_x$O Films According to the Invention The formation of copper oxide films is realized by a thermal ALD process. A precursor a mixture of 99 mol-% Cu (I) β-diketonate[("Bu$_3$P)$_2$Cu(acac)] as first precursor and 1 mol-% of [($\eta^5$-C$_5$H$_4$SiMe$_3$)($\eta^5$-C$_7$H$_{11}$)Ru] as second precursor is used:

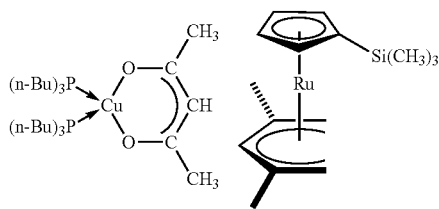

The precursor mixture is fed to the reaction chamber with the aid of a liquid metering system comprising an evaporator unit. The precursor mixture is stored under argon as inert gas at room temperature in a storage container. For metering, the liquid precursor mixture is transported with the aid of the superatmospheric inert gas pressure in the storage vessel out of said vessel and via a flow meter to a mixing unit in which the precursor mixture is metered with the aid of a nozzle and mixed with an inert carrier gas stream (in particular argon carrier gas stream). This mixture is fed to the evaporator unit, where the precursor mixture is vaporized at 100° C. The carrier gas/precursor vapor mixture thus obtained is now fed to the reaction chamber. Expediently, this is effected via heated pipes. The duration of the precursor pulse carried out in this manner is 5 seconds; the precursor vapor is fed to the process chamber at a rate of 15 mg/min and an argon carrier gas flow rate of 700 sccm (standard cubic centimeters per minute) and the precursor mixture is chemisorbed on the surface of the substrate (for example TaN or SiO$_2$). A purge pulse of 8 seconds follows, in which argon is fed to the reaction chamber at a rate of 145 sccm. For the oxidation pulse, a mixture of oxygen and water vapor is used as the oxidizing agent for 5 seconds pulsing time. For producing the water vapor, argon is passed through water which was heated to 45° C. to 50° C. and in this way is laden with water vapor. The oxidation pulse as well as the adsorption pulse is carried out at 120° C. and a pressure from 0.6 to 1.2 mbar and. For this purpose, oxygen at a flow rate of 90 sccm and 18.5 mg/min of water vapor with an argon carrier gas flow rate of 210 sccm (the latter preferably via heated pipes) is fed to the reaction chamber. This is once again followed by a purge pulse as described above. Summarizing, one ALD cycle needs 22 seconds with precursor pulse (4 s)/Ar purge pulse (5 s)/oxidation pulse (8 s)/Ar purge pulse (5 s). On TaN as a substrate, a copper oxide layer of 5 nm is obtained after 400 ALD cycles. The reduction step of the obtained copper oxide containing layer is carried out with formic acid vapor as reduction agent at 115° C. and 1.3 mbar for 20 min as well as 60 min process times. Formic acid vapor is delivered with a flow rate of 82 mg/min together with 100 sccm argon as carrier gas. The Cu (II) contributions are completely removed after the reduction, and the enhanced Cu LMM Auger signal indicates the formation of metallic copper.

Measurements of the Copper-Containing Coating Obtained as Described Before:

The Auger electron spectroscopy (AES) analysis of the coating obtained before the reduction step was carried out reveals that in the 5 nm thick Cu$_x$O film described before, ruthenium is present in a slightly higher amount compared to the precursor mixture (see FIG. 1). The higher amount might be reasoned by an enrichment of Ru at the surface or higher adsorption probability of the Ru precursor molecules owing to different steric properties or a stronger reactivity. The AES as well as the XPS measurements below are carried out according to "S. Hofmann: Depth Profiling in AES and XPS in: Practical Surface Analysis Second Edition Volume 1—Auger and X-ray Photoelectron Spectroscopy. (Editors D. Briggs and M. P. Seah) John Wiley & Sons, Chichester et al., 1990".

Figure 2A:
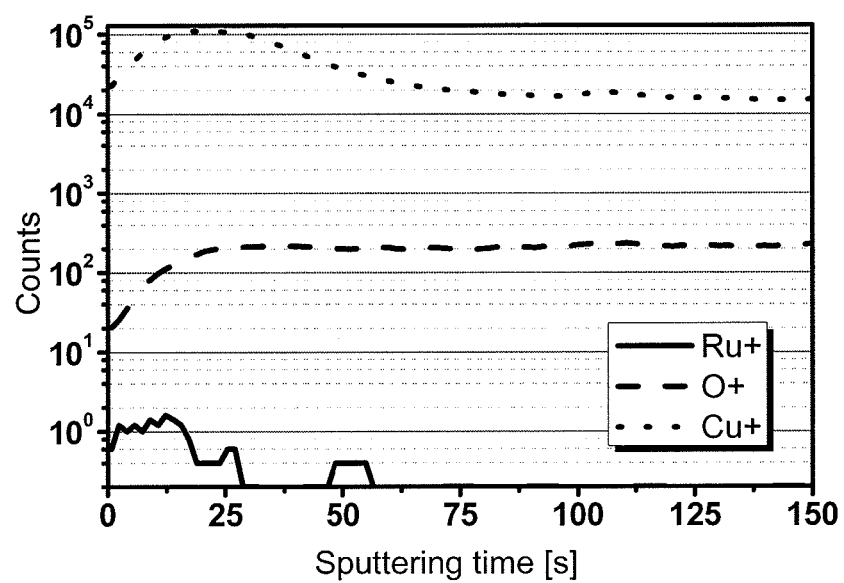
FIGS. 2a and 2b show Time-of-Flight Secondary Ion Mass Spectrometry spectra of an ALD copper oxide film on a TaN substrate obtained with and without a second precursor.
Figure 2B:
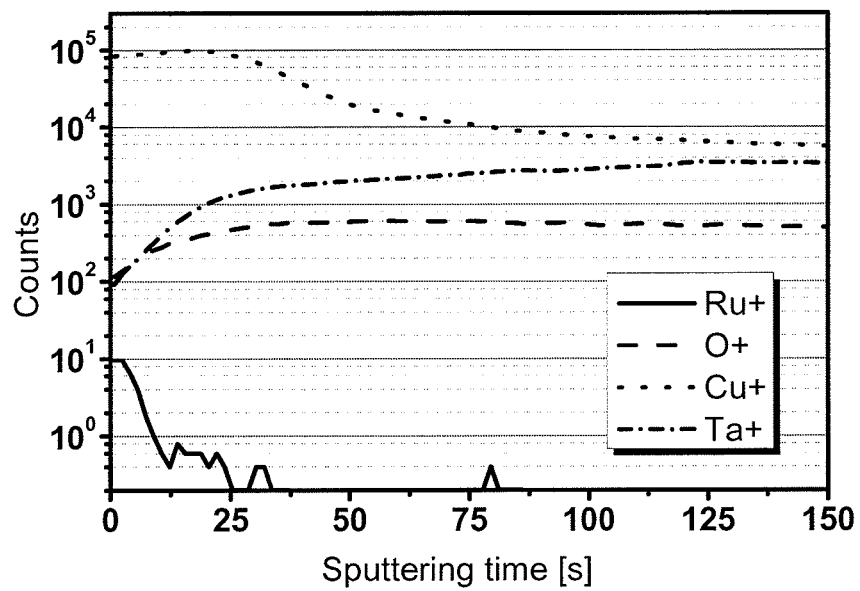

Further, the copper-containing coating is investigated by Time-of-Flight Secondary Ion Mass Spectrometry (ToF-SIMS) for the evaluation of the ruthenium content in the $Cu_xO$ films after the ALD. Again the presence of Ru in the surface layer is detected. FIG. 2 shows the TOF-SIMS results (sputter parameters: $O_2$, 0.5 keV, 64.6 nA) of $Cu_xO$ without a second precursor on TaN (FIG. 2a) and ALD $Cu_xO$ obtained as described before (FIG. 2b). The ToF-SIMS measurements are carried out according to "D. J. O'Connor, B. A. Sextron, R. St. C. Smart: Surface Analyses Methods in Materials Science—SIMS Secondary Ion Mass Spectrometry, 2003.

The results after the reduction step are shown in FIG. 3a to FIG. 3d. Here, the ex situ XPS analysis of the Cu 2p (a) and Cu LMM (b) transition is shown.

Figure 3A:
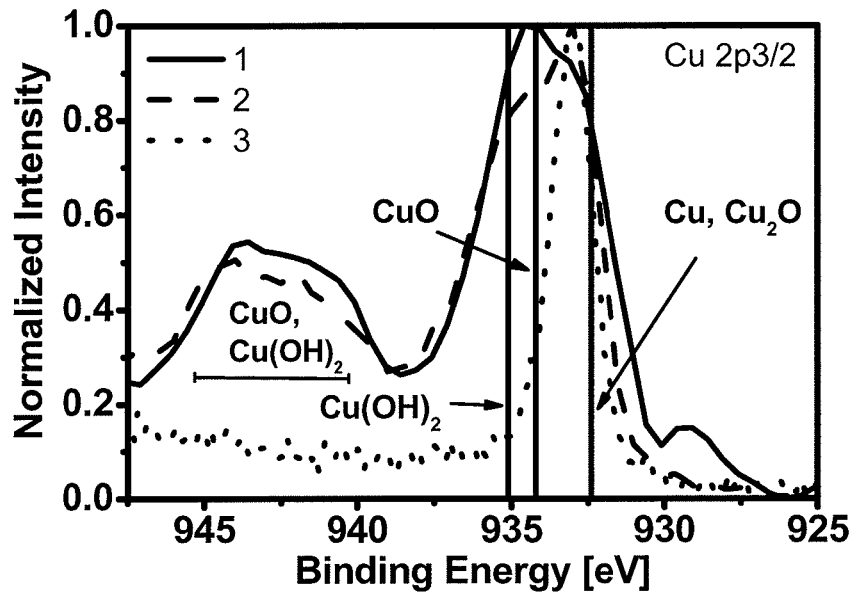
FIG. 3a-FIG. 3d show XPS spectra of ALD copper oxide films and reduced copper oxide films on $SiO_2$ and TaN substrates obtained with and without a second precursor.
Figure 3B:
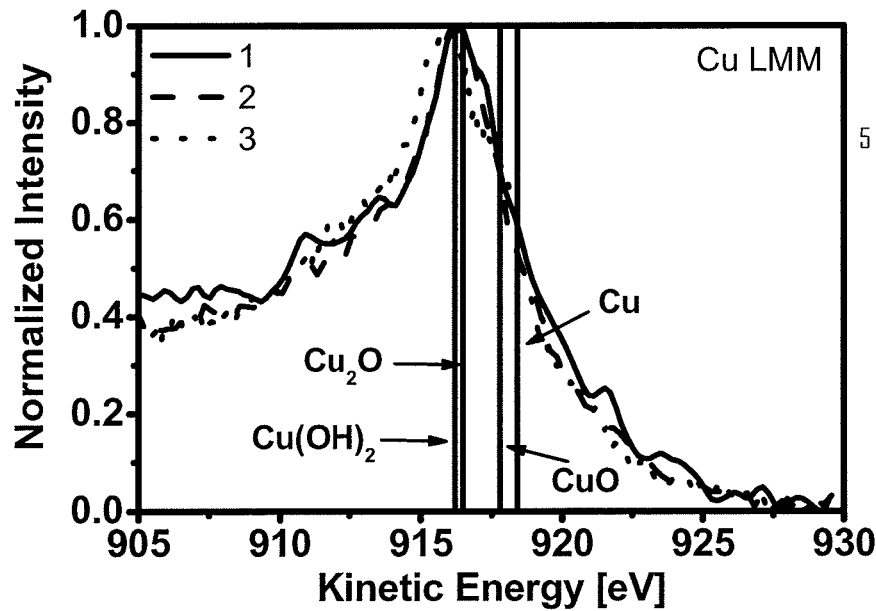

In FIG. 3a and FIG. 3b, the XPS results for the following samples are shown:
A 4 nm copper oxide ALD layer (obtained before the reduction step—400 ALD cycles), which is produced as described above but without a second precursor and on a $SiO_2$ substrate instead of a TaN substrate (reference mark 1),
the same layer after HCOOH treatment at 115° C. (reference mark 2),
a 4 nm copper ALD layer after HCOOH treatment at 115° C. according to the invention, which is produced as described before with the second precursor $[(\eta^5-C_5H_4SiMe_3)(\eta^5-C_7H_{11})Ru]$ on the $SiO_2$ substrate (reference mark 3).
The reduction of the copper oxide layer with HCOOH was clearly improved as result of the second precursor. Residual Cu (I) components are present probably due to the air contact before the ex situ XPS characterizations.

Figure 3C:
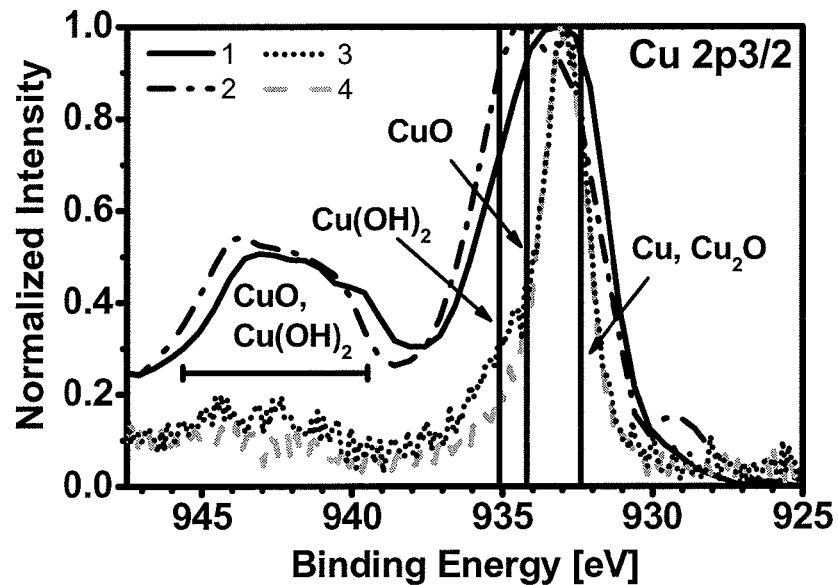
Figure 3D:
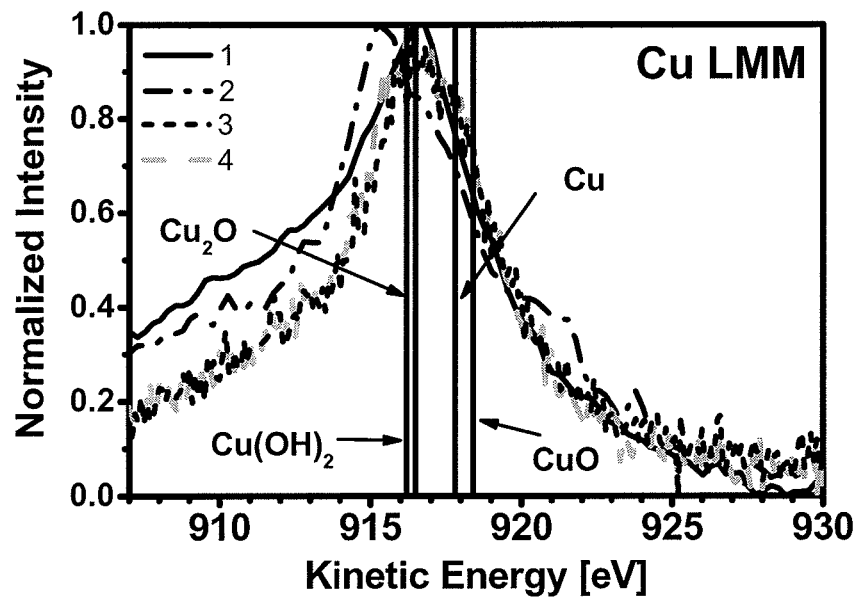

In FIG. 3c and FIG. 3d, the XPS results for the following samples are shown:
A 5 nm copper oxide ALD layer (obtained before the reduction step—400 ALD cycles), which is produced as described above but without a second precursor and on a TaN substrate (reference mark 1),
the same layer after HCOOH treatment for 20 min at 115° C. (reference mark 2),
a 5 nm copper ALD layer after HCOOH treatment for 20 min at 115° C. according to the invention, which is produced as described before with the second precursor $[(\eta^5-C_5H_4SiMe_3)(\eta^5-C_7H_{11})Ru]$ on the TaN substrate (reference mark 3),
a 5 nm copper ALD layer after HCOOH treatment for 60 min at 115° C. according to the invention, which is produced as described before with the second precursor $[(\eta^5-C_5H_4SiMe_3)(\eta^5-C_7H_{11})Ru]$ on the TaN substrate (reference mark 4).
The reduction of the copper oxide layer with HCOOH was clearly improved as result of the second precursor. Residual Cu (I) components are present probably due to the air contact before the ex situ XPS characterizations.

The invention claimed is:
1. A method for producing a coated substrate, the method comprising:
  providing a first precursor, a second precursor and a substrate, the first precursor being a copper complex that contains no fluorine and the second precursor being selected from a ruthenium complex, a nickel complex, a palladium complex, and mixtures thereof;
  depositing a layer using atomic layer deposition (ALD) at least on partial regions of a surface of the substrate by using the first precursor and the second precursor, the layer containing copper and at least one of ruthenium, nickel and palladium, wherein a molar ratio of the first precursor of at least 90% and a molar ratio of the second precursor of not more than 2% is used;
  wherein the atomic layer deposition includes a pulse, in which the first and the second precursor are evaporated, and in which the substrate is exposed to a precursor mixture of the first precursor and the second precursor; and
  wherein during said pulse, the first precursor and the second precursor are either:
  used as a mixture of the first and the second precursor, the mixture being evaporated from exactly one evaporation unit, or
  simultaneously evaporated from a first evaporation unit and a second evaporation unit, wherein the evaporation of the second precursor from the second evaporation unit starts at least milliseconds before the evaporation of the first precursor from the first evaporation unit; and
  wherein the second precursor, oxidized metal obtained from the second precursor during the ALD and/or elemental metal obtained from the second precursor during the ALD, respectively, act either
    as a catalyst for a reduction pulse performed during the ALD and/or
    as a catalyst for an oxidation pulse performed during the ALD and/or
    as a catalyst for a reduction effected after having deposited the copper containing layer by ALD, wherein in said reduction the reaction of a reducing agent with the copper-containing layer obtained by the ALD is catalyzed.

2. The method as claimed in claim 1, wherein the method comprises performing the reduction, wherein in said reduction a reducing agent acts on the substrate obtained after depositing the copper-containing layer.

3. The method as claimed in claim 1, wherein depositing the layer comprises:
  (a) performing an adsorption pulse, in which the substrate is exposed to a precursor mixture
  (b) performing a purge pulse or evacuation pulse; and
  (c) performing an oxidation pulse, followed by a purge pulse or evacuation pulse, and/or reduction pulse, followed by a purge pulse or evacuation pulse, wherein the substrate is treated with the oxidizing agent during the oxidation pulse and the substrate is treated with the reducing agent during the reduction pulse;
  wherein (a), (b) and (c) are repeated a plurality of times in the stated sequence.

4. The method as claimed in claim 1, wherein the first precursor is liquid at room temperature.

5. The method as claimed in claim 4, wherein the second precursor is liquid at room temperature.

6. The method as claimed in claim 1, wherein
the first precursor complex is an 18 valence electron copper (I) complex.

7. The method as claimed in claim 1, wherein
the first precursor is a complex selected from at least one complex of the formulae $L_2Cu(X\cap X)$, $Cu(X\cap X)_2$, $LCu(X\cap X)$
where
L are identical or different σ-donor-π acceptor ligands and/or identical or different σ,π-donor-π acceptor ligands, and
$X\cap X$ is a bidentate ligand selected from the group consisting of β diketonates, β ketoiminates, β diiminates, amidinates, carboxylates and thiocarboxylates.

8. The method as claimed in claim 7, wherein the first precursor is a complex in which the bidentate ligand X∩X has the formula R—C(X*)—CR$^8$—C(Y)—R$^1$, wherein:

X* and Y are identical or different and are O or NR$^2$,

R, R$^1$ and R$^2$ are identical or different and are a branched, straight-chain or cyclic alkyl radical, an aryl radical or a trialkylsilyl radical, in particular a methyl, ethyl, n propyl, isopropyl, n butyl, tert-butyl or phenyl radical, and R$^8$ is a branched, straight-chain or cyclic alkyl radical, an aryl radical or a trialkylsilyl radical, in particular a methyl, ethyl, n propyl, isopropyl, n butyl, tert-butyl or phenyl radical.

9. The method as claimed in claim 7, wherein the first precursor is a complex in which the bidentate ligand X∩X has the formula R3-C(X')—Y', where X' is O, S or NR$^4$, Y' is O or NR$^4$, and R$^3$ and R$^4$ are identical or different and are a branched, straight-chain or cyclic alkyl radical or an aryl radical.

10. The method as claimed in claim 7, wherein the bidentate ligand X∩X has the formula R$^5$O—C(O)—Z—C(O)—O, wherein Z is an alkylene or alkylidene bridge or a bond between the two carbonyl groups and has the formula (CH$_2$)$_n$ (where n=0, 1 or 2) or the formula (CH=CH)$_m$ (where m=0, 1 or 2), and R$^5$ is a branched, straight-chain or cyclic alkyl radical or an aryl radical, in particular a methyl, ethyl, n propyl, isopropyl, n butyl, tert-butyl or phenyl radical.

11. The method as claimed in claim 1, wherein the second precursor is selected from a Ru(III) complex, a Ru(II) complex, a Ru(0) complex, a Ni(II) complex, a Ni(0) complex, a Pd(II) complex and mixtures thereof.

12. The method as claimed in claim 11, wherein the second precursor is selected from at least one of the following complexes of the formulae L$^1$L$^2$M or L$^3$Ru(II)L$^1$L$^4$ wherein M is Ru(II) Ni(II) or Pd(II)

L$^1$ and L$^2$ are the same or different and are bidentate ligands X∩X or enyl ligands, L$^3$ is a substituted or unsubstituted aren L$^4$ is a monodentate carboxylate or thiocarboxylate wherein X∩X is selected from the group consisting of β diketonates, β ketoiminates, β diiminates, amidinates, carboxylates and thiocarboxylates, wherein the enyl ligands are cyclic or non cyclic and at least tridentate.

13. The method as claimed in claim 12, wherein the second precursor is a complex in which the bidentate ligand X∩X has the formula R—C(X*)—CR$^8$—C(Y)—R$^1$, wherein:

X* and Y are identical or different and are O or NR$^2$,

R, R$^1$ and R$^2$ are identical or different and are a branched, straight-chain or cyclic alkyl radical, an aryl radical or a trialkylsilyl radical, in particular a methyl, ethyl, n propyl, isopropyl, n butyl, tert-butyl or phenyl radical, and R$^8$ is a branched, straight-chain or cyclic alkyl radical, an aryl radical or a trialkylsilyl radical, in particular a methyl, ethyl, n propyl, isopropyl, n butyl, tert-butyl or phenyl radical.

14. The method as claimed in claim 12, wherein the second precursor is a complex in which the bidentate ligand X∩X has the formula R3-C(X')—Y', where X' is O, S or NR$^4$, Y' is O or NR$^4$, and R$^3$ and R$^4$ are identical or different and are a branched, straight-chain or cyclic alkyl radical or an aryl radical.

15. The method as claimed in claim 12, wherein the bidentate ligand X∩X has the formula R$^5$O—C(O)—Z—C(O)—O, wherein Z is an alkylene or alkylidene bridge or a bond between the two carbonyl groups and has the formula (CH$_2$)$_n$ (where n=0, 1 or 2) or the formula (CH=CH)$_m$ (where m=0, 1 or 2), and R$^5$ is a branched, straight-chain or cyclic alkyl radical or an aryl radical, in particular a methyl, ethyl, n propyl, isopropyl, n butyl, tert-butyl or phenyl radical.

16. The method as claimed in claim 12, wherein the enyl ligand is selected from the group consisting of substituted or unsubstituted cyclopentadienyl, substituted or unsubstituted pentadienyl, substituted or unsubstituted allyl.

17. The method as claimed in claim 3, wherein the oxidizing agent is liquid or gaseous and is selected from the group consisting of oxygen, water, H$_2$O$_2$, ozone, N$_2$O, and mixtures thereof.

18. The method as claimed in claim 2, wherein the reducing agent is selected from the group consisting of alcohols, aldehydes and carboxylic acids.

19. The method as claimed in claim 18, wherein the reducing agent is selected from the group consisting of isopropanol, formaldehyde and formic acid.

20. The method as claimed in claim 3, wherein the adsorption pulse lasts for not more than 11 seconds.

21. The method as claimed in claim 3, wherein the adsorption pulse is carried out at a temperature of from 105° C. to 165° C.

22. The method as claimed in claim 2, wherein the reduction-step is carried out at a temperature of less than 250° C.

23. The method as claimed in claim 1, wherein the substrate comprises one layer or a plurality of layers and wherein at least one of the layers comprises a layer selected from the group consisting of a transition metal, a transition metal salt, a semiconductor material, an organic polymer and an inorganic polymer.

24. The method as claimed in claim 23, wherein the substrate comprises a material selected from the group consisting of Ta, Ti, W, Nb, V, nitrides, carbonitrides or silicon nitrides of Ta, Ti, W, Nb, V, Pt, Pd, Ru, Rh, SiO$_2$, silicates, ZnO, HfO$_2$, Al$_2$O$_3$, ZrO$_2$, Si, Ge, GaAs, AlGaAs, GaN, AlGaN, InP, InGaAlP and InGaP.

25. A method for producing a coated substrate, the method comprising:

providing a first precursor, a second precursor and a substrate, the first precursor being a copper complex that contains no fluorine and the second precursor being selected from a ruthenium complex, a nickel complex, a palladium complex, and mixtures thereof;

depositing a layer using atomic layer deposition (ALD) at least on partial regions of a surface of the substrate by using the first precursor and the second precursor, the layer containing copper and at least one of ruthenium, nickel and palladium, wherein a molar ratio of the first precursor is at least 90%;

wherein depositing the layer comprises:

(a) performing an adsorption pulse, in which the first and the second precursor are evaporated, and in which the substrate is exposed to a precursor mixture of the first precursor and the second precursor;

(b) performing a purge pulse or evacuation pulse; and (c) performing (c$_1$) an oxidation pulse, followed by a purge pulse or evacuation pulse, or (c$_2$) an oxidation pulse, followed by a purge pulse or evacuation pulse, followed by a reduction pulse, followed by a purge pulse or evacuation pulse, wherein the substrate is treated with an oxidizing agent during the oxidation pulse so as to form a copper oxide containing layer; and wherein the second precursor, oxidized metal obtained from the second precursor during the ALD and/or elemental metal obtained from the second precursor during the ALD, respectively, act either as a catalyst for the oxidation pulse of (c1) or (c2) and/or as a catalyst for the reduction pulse of (c2) and/or as a catalyst for a reduction effected after a predetermined number of pulses according to (c1) or (c2), wherein in said reduction the reaction of a reducing agent with the layer obtained by the ALD is catalyzed.

* * * * *